United States Patent
Tehrani et al.

(10) Patent No.: US 6,285,581 B1
(45) Date of Patent: Sep. 4, 2001

(54) MRAM HAVING SEMICONDUCTOR DEVICE INTEGRATED THEREIN

(75) Inventors: Saied Tehrani, Tempe, AZ (US); Jing Shi, Salt Lake City, UT (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/460,056

(22) Filed: Dec. 13, 1999

(51) Int. Cl.⁷ ..................................... G11C 11/15
(52) U.S. Cl. .................. 365/173; 365/174; 365/145; 365/158
(58) Field of Search ..................... 365/173, 171, 365/174, 66, 74, 55, 158, 203, 145, 164

(56) References Cited

U.S. PATENT DOCUMENTS

| | | | |
|---|---|---|---|
| 4,780,848 | 10/1988 | Daughton et al. | 365/173 |
| 5,343,422 | 8/1994 | Kung et al. | 365/173 |
| 5,734,605 | 3/1998 | Zhu et al. | 365/173 |
| 5,745,408 | * 4/1998 | Chen et al. | 365/173 |
| 5,774,394 | * 6/1998 | Chen et al. | 365/158 |
| 5,838,608 | * 11/1998 | Zhu et al. | 365/158 |
| 5,943,574 | 8/1999 | Tehrani et al. | 438/300 |
| 5,959,880 | * 9/1999 | Shi et al. | 365/158 |
| 6,069,820 | * 5/2000 | Inimata et al. | 365/171 |
| 6,178,112 | * 1/2001 | Bessho et al. | 365/173 |

* cited by examiner

*Primary Examiner*—David Nelms
*Assistant Examiner*—Thong Le
(74) *Attorney, Agent, or Firm*—William E. Koch

(57) ABSTRACT

A magnetic memory cell (10) has a semiconductor layer (12) positioned between first (11) and second (13) ferromagnetic layers forming either a p-n or Schottky junction. A magnetic layer (34) is positioned between the first ferromagnetic layer and a digit line (first) for pinning a magnetic vector within the second ferromagnetic layer. In a 13 embodiment, a gate contact (37) is spaced apart from the layer of semiconductor material for controlling the electron flow through the semiconductor layer.

20 Claims, 2 Drawing Sheets

MRAM HAVING SEMICONDUCTOR DEVICE INTEGRATED THEREIN

BACKGROUND OF THE INVENTION

The present invention relates in general to memory cells and, more particularly, to a Magnetic Random Access Memory Cell (MRAM).

A variety of magnetic materials and structures have been utilized to form magnetoresistive materials for non-volatile memory elements, sensors, read/write heads for disk drives, and other magnetic type applications. One prior magnetoresistive element utilized a magnetoresistive material that has two magnetic layers separated by a conductor layer. The magnetization vectors of the two magnetic layers typically are anti-parallel to each other in the absence of any magnetic fields. The magnetization vectors of one of the layers points in one direction and the magnetization vector of the other layer always points in the opposite direction. The magnetic characteristics of such magnetic materials typically require a width greater than one micron in order to maintain the orientation of the magnetization vectors along the width of the cell. The large width requirement limits the density of memories utilizing such materials. Additionally, reading the state of such memories typically requires a two-phase read operation that results in very long read cycles. The two phase read operation also requires extra circuitry to determine the state of the memory, thus increasing the cost of such memories. An example of such a magnetic material and memory is disclosed in U.S. Pat. No. 4,780,848 issued to Daughton et al. on Oct. 25, 1988.

Another prior material uses multi-layer giant magnetoresistive materials (GMR) and utilizes submicron width, in order to increase density. In this structure, the two magnetic layers are also separated by a conductor layer and the magnetization vectors are parallel to the length of the magnetic material. In one embodiment the magnetization vector of one magnetic material layer is always maintained in one direction while the magnetization vector of the second magnetic layer switches between parallel and anti-parallel to the first vector.

In these two above described materials, electrons having a specific "spin" (magnetization vector points in a specific direction) conduct in-plane through the stack of the two magnetic layers and a conductor spacer layer. If the spin of the two magnetic layers are the same, the electrons travel through the stack with low scattering which results in low resistance. If the spin of one of the magnetic layers is opposite to the other magnetic layer, the electron of a given spin cannot easily travel to the other magnetic layer. This results in increased electron scattering and therefore a higher resistance can be measured.

In order to determine the logical state of a memory cell utilizing these materials, the memory cell has a reference cell and an active cell. The reference cell always provides a voltage corresponding to one state (either always a "1" or always a "0"). The output of the reference cell is compared to the output of the active cell in order to determine the state of the memory cell. The requirement for an active and a reference cell reduces the density of a memory that utilizes such elements. An example of such a magnetic material and memory is disclosed in U.S. Pat. No. 5,343,422 issued to Kung et al. on Aug. 30, 1994.

Yet another prior material using multi-layer magnetoresistive materials of submicron width comprises two magnetic layers separated instead by an insulator spacer (known as a tunnel junction). In one embodiment the magnetization vector of one magnetic material layer is always maintained in one direction while the magnetization vector of the second magnetic layer switches between parallel and anti-parallel (parallel but opposite) to the first vector.

In this tunnel junction, electrons having a specific "spin" (magnetization vector points in a specific direction) tunnel from one magnetic layer through the insulator spacer to the other magnetic layer. If the spin of the receiving magnetic layer is the same as the electron, the electron easily tunnels into the magnetic layer and therefore a low resistance is measured. If the spin of the receiving magnetic layer is the opposite of the electron, the electron cannot easily tunnel to the second magnetic layer and a higher resistance is measured.

In order to determine the logical state of a memory cell utilizing this material, a resistance difference between the two possibilities is detected. An example of such a magnetic material and memory is disclosed in U.S. Pat. No. 5,734,605 issued to Zhu et al. on Mar. 31, 1998.

A magnetic random access memory (MRAM) is a non-volatile memory which basically includes one of these materials, an active device which can be a transistor or diode connected to a sense line, and a word line. The MRAM employs the magnetoresistance effect to store memory states. Magnetic vectors in one or all of the magnetic layers of the material are switched very quickly from one direction to an opposite direction when a magnetic field is applied to the material over a certain threshold. According to the direction of the magnetic vectors in the material, states are stored, for example, one direction can be defined as a logic "0", and another direction can be defined as a logic "1". The material maintains these states even without a magnetic field being applied. The states in the material can be read by passing a current through the cell in a sense line, because of the difference between the resistances of the two magnetic states. An example of such a magnetic material and memory is disclosed in U.S. Pat. No. 5,838,608 issued to Zhu et al. on Nov. 17, 1998.

Each of the above described memory elements require a diode or a transistor to control the current through the element. The diode or transistor is connected in series with the material, e.g., drain, gate, source, magnetic layer, insulator (or conductor), and magnetic layer. This transistor for each memory cell increases the cost of the memory and decreases the density of the chip. An example of such a circuit arrangement is disclosed in U.S. Pat. No. 5,734,605 issued to Zhu et al. on Mar. 31, 1998.

In addition, in the memory elements based on conductive spacer layer, the resistance of the element is mainly controlled by the resistance of the conductive spacer layer which is low. In the case of an insulating spacer layer, the resistance of the element is exponentially dependent on the thickness of the insulating spacer layer and is high and difficult to control uniformly and reproducibly. Also the resistance is inversely proportional to the size (area) of the magnetic bit; therefore, the resistance increases as the cell size decreases for higher memory density.

DETAILED DESCRIPTION OF THE PREFERRED EMBODIMENT

Figure 1:
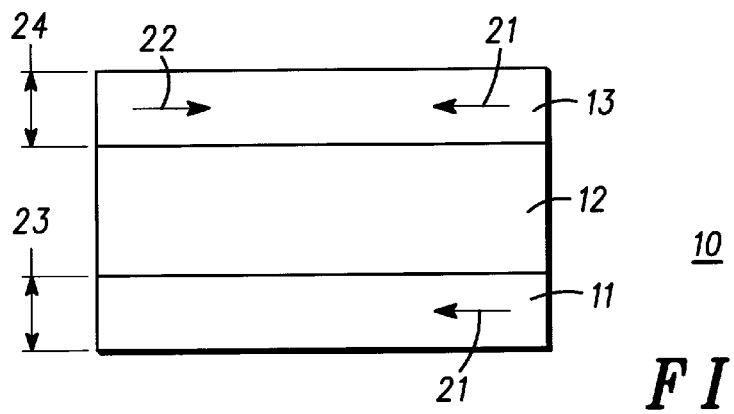
FIG 1 is a simplified side view of a multi-layer magnetic memory cell in accordance with the present invention.

Referring to FIG. 1, a memory cell in accordance with the present invention includes a magnetic memory cell 10 having a first ferromagnetic layer 11 and a second ferromagnetic layer 13, which are separated by a semiconductor layer 12. First and second ferromagnetic layers 11 and 13 each can be, for example, single layers of ferromagnetic materials such as nickel, iron, cobalt, or alloys thereof. As another example, the ferromagnetic layers 11 and 13 could be a composite ferromagnetic, such as a layer of nickel-iron-cobalt covering a layer of cobalt-iron or three layer structures including layers of cobalt-iron and nickel-iron-cobalt and cobalt-iron with cobalt-iron at the interface with adjacent layers.

As another example, one of the ferromagnetic layers 11 and 13 could be exchange pinned by a layer of antiferromagnetic manganese based material like iron-manganese, nickel-manganese, platinum manganese, iridium manganese or similar pinning material.

Materials that are suitable for semiconductor layer 12 include, for example, most semiconductor materials such as germanium, silicon, or gallium arsenide. First and second ferromagnetic layers 11 and 13 typically comprise different materials and/or different thicknesses or one being exchange pinned, thereby providing a distinct resistance change depending on the magnetic state.

Although shown having two ferromagnetic layers in this embodiment, it should be understood the magnetic cell 10 could have additional layers stacked on top forming multiple cells. For example, another semiconductor material (not shown) could be positioned above the second ferromagnetic layer 13, and a third ferromagnetic layer (not shown) positioned on top of the second semiconductor layer.

It should also be understood that there could be an interfacial layer of another material between the ferromagnetic layer and semiconductor layer in order to enhance the injection of the electron in and out of a ferromagnetic layer into a semiconductor layer.

Figure 2:
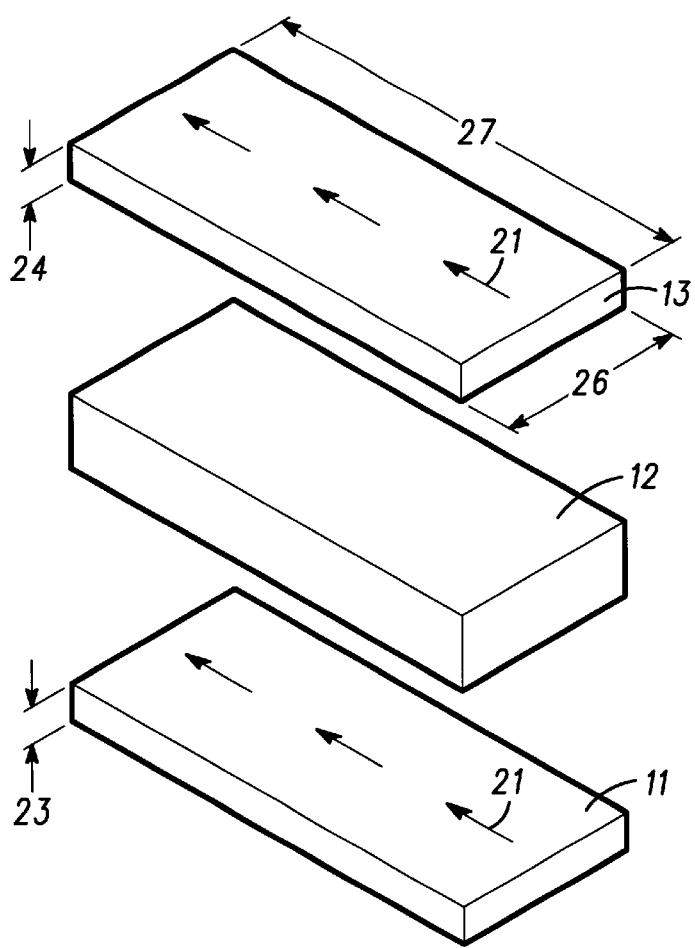
FIG. 2 is a simplified exploded view of the multi-layer magnetic memory cell illustrated in FIG. 1.

Turning now to FIG. 2, an enlarged exploded view of cell 10 is illustrated. Portions of FIG. 2 that have the same reference numbers as FIG. 1 are the same as the corresponding FIG. 1 elements. In the preferred embodiment, ferromagnetic layers 11 and 13 are rectangular and are formed with the easy axis of magnetization along a length 27 and not along a width 26. Ferromagnetic layers 11 and 13 each have magnetization vectors 21 that are positioned substantially along length 27, that is, substantially parallel to length 27. Additionally, width 26 is formed to be smaller than the width of the magnetic domain walls or transition width within layers 11 and 13. Consequently, vectors 21 can not be parallel to width 26. Typically, widths of less than 1.0 to 1.2 microns result in such a constraint. In the preferred embodiment, width 26 is less than one micron and is as small as can be made by manufacturing technology, and length 27 is greater than width 26, generally five times or greater.

As illustrated in FIG. 1, vectors 21 and 22 in ferromagnetic layers 11 and 13 represent two different states of magnetization within cell 10. In this embodiment, the magnetic vector 21 in ferromagnetic layer 11 is "pinned" in one direction by a magnetic layer (described later). Another embodiment could include the ferromagnetic layer 11 having both vectors 21 and 22. It should be understood that these are the same vectors and that they are given different numbers only to indicate different states. One state is referred to as a logic "0" and the other state is a logic "1". While it will be understood by those skilled in the art that any logic definition can be assigned to either state, in this example when vectors 21 of ferromagnetic layers 11 and 13 both point to the left in FIG. 1, cell 10 is in a logic "0" state and when vector 22 in ferromagnetic layer 13 is in the opposite direction cell 10 is in a logic "1" state. Thus, for a first state magnetization vectors in both layers 11 and 13 point in a first direction and for a second state magnetization vectors in layers 11 and 13 are pointing in the opposite direction. The magnetic vectors are only pointing in opposite directions (antiparallel) when specific magnetic fields are applied to cell 10, as will be explained in more detail presently.

Cell 10 may be designed with one of ferromagnetic layers 11 or 13 thinner than the other so that a smaller magnetic field will switch the magnetization vectors of the thinner layer than is required to switch the magnetization vector of the other layer. Another way to accomplish this result is to form one layer out of magnetic material that requires a higher magnetic field to switch the magnetization vectors.

The provision of semiconductor layer 12 between ferromagnetic layers 11 and 13 produces a medium which allows a flow of current (electron drift) perpendicularly through semiconductor layer 12, from ferromagnetic layer 11 to ferromagnetic layer 13 (or vice versa). For example, in this structure depending on the polarization of the ferromagnetic material 11, a larger proportion of electrons with a given spin (up or down) will be injected into the semiconductor material. The electrons will then maintain their spin polarization during transport through the semiconductor material and will drift to the other ferromagnetic contact 13. If the polarization of the other ferromagnetic contact 13 is same as the injecting ferromagnetic contact 11, electrons will drift to the ferromagnetic contact 13 with a minimum resistance. If the polarization of the other ferromagnetic contact 13 is opposite to the injecting ferromagnetic contacts 11, some of the electrons will not be able to drift to the ferromagnetic contact 13. Therefore, the resistance of the cell is higher. When the magnetization vectors in layers 11 and 13 are antiparallel, the resistance of cell remains very high. When the magnetization vectors in ferromagnetic layers 11 and 13 are parallel, the resistance of cell 10 drops perceptibly.

Figure 3:
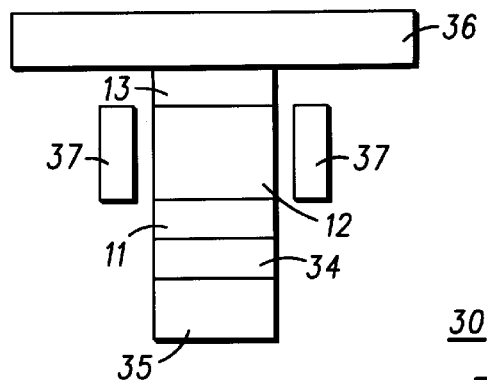
FIG. 3 is a simplified section view of a memory unit including the multi-layer magnetic memory cell of FIG. 1.
Figure 4:
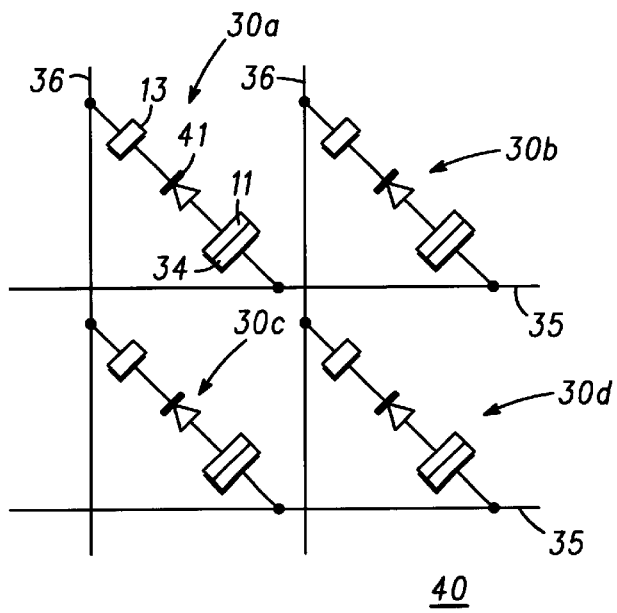
FIG. 4 is a schematic representation of an array of cells illustrated in FIG. 3.

FIG 3 is a simplified sectional view of a cell 30, similar to that illustrated in FIG. 1, connected in a first embodiment. It will of course be understood that for convenience FIG. 4 illustrates only one of a single row of cells in an array and that the array extends into and out of the paper as well as to the left and right. Cell 30 includes first and second ferromagnetic layers 11 and 13 with a layer of semiconductor material 12 sandwiched therebetween.

In this embodiment, an antiferromagnetic layer 34 is positioned in electrical contact with ferromagnetic layer 11 for pinning the magnetic vector 21 in a specific direction. Magnetic layer 34 may comprise, for example, iron-manganese or nickel-manganese or platinum manganese or iridium manganese or similar pinning material. An electrical conductive material comprising a digit line 35 is in electrical contact with the ferromagnetic layer 34. Another electrical conductive material comprising a bit line 36 is in electrical contact with the ferromagnetic layer 13.

Gate contacts 37 are optional in the present invention. Without the gate contacts 37, the semiconductor layer 12 serves as a diode, where it can be either a Schottky or a p-n junction diode. In this case the electron charge conduction is dependent on the direction of the bias that is applied between the contacts 35 and 36. With a gate 37, the semiconductor serves as a transistor, where the electron conduction is through a channel and the electron charge is modulated by the gate. The gate may be formed as taught in U.S. Pat. No. 5,943,574 issued to Tehrani et al. dated Aug. 24, 1999.

Referring to FIG. 4, an embodiment of an array 40 of cells similar to cell 30 is illustrated with the cells 30 being oriented in rows and columns. Only four cells 30a through 30d are illustrated for convenience, but it will be understood that any desired number of cells which can be practically fabricated can be employed. Four diodes 41 through 44 are illustrated, one each being associated with each cell 30a–30d. In this embodiment, the resistances of the cells 30a–30d and the diodes 41–44 are both inherent in the semiconductor layer 12.

Continuing with FIG. 4, cell 30 has the ferromagnetic layer 13 connected to the bit line 36 and the ferromagnetic layer 11 connected through the ferromagnetic layer 34 to the digit line 35. Thus, cell 30 is uniquely addressed by selecting bit line 36 and digit line 35. Any change in resistance of cell 30 can be easily and quickly sensed by connecting sensing apparatus between bit line 36 and digit line 35. The diode action of the semiconductor layer 12 limits current flow through cell 30 and substantial prevents any other current paths from being formed in array 40.

Figure 5:
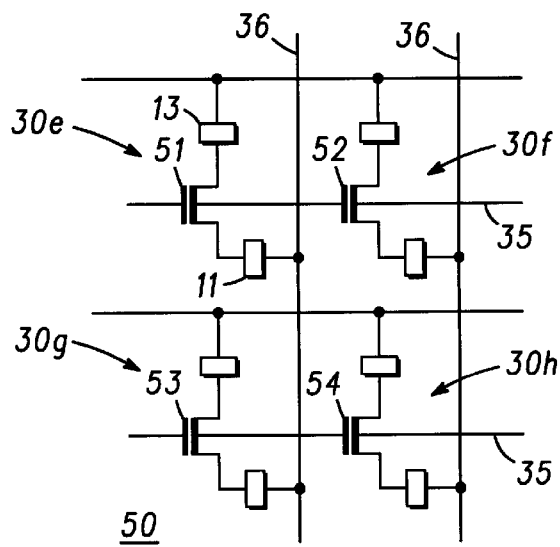
FIG. 5 is a schematic representation of another embodiment of an array of cells similar to those illustrated in FIG. 3.

Referring to FIG. 5, another embodiment of an array 50 of cells similar to cell 30 is illustrated with the cells being oriented in rows and columns. Only four cells 30e through 30h are illustrated for convenience, but it will be understood that any desired number of cells which can be practically fabricated can be employed. A plurality of transistors 51 through 54 are shown, one each being associated with each cell 30e through 30h. In this embodiment, the resistances of the cells 30e–30h and the transistors 51–54 are both inherent in the semiconductor layer 12. For each cell 30e–30h, the first ferromagnetic layer 11 is coupled between the bit line 36 and the respective transistor 51–54, and the second ferromagnetic layer 13 is coupled between the digit line 35 and the respective transistor 51–54. The gates of the transistors 51 through 54 comprise, for example, a polysilicon material. The gate of each transistor 51 through 54 serves as a switch for selecting a particular cell (bit) to read. This arrangement of the diode or transistor incorporated within the memory cell will allow for a higher density over the prior art.

As shown above an active device is now integrated inside the memory element. This results in simpler memory element and reduces the cost of the memory and increases the density of the chip.

In addition resistance of the element can be easily controlled by the thickness and/or doping of the semiconductor spacer layer. This results in a well control of the resistance in order to achieve high yield, low cost memory. In addition the easily controllable resistance of the element can be utilized to tune the resistance of element in order to achieve the high speed integrated circuit.

In addition, since the resistance is controlled by the doping in the semiconductor, the thickness of the semiconductor layer does not have to be very thin, unlike in the tunneling case. Therefore, the Neel coupling between the magnetic layers can be reduced and a symmetrical hysteresis loop can be achieved.

What is claimed is:

1. A magnetic memory cell comprising:
    a first ferromagnetic layer;
    a second ferromagnetic layer;
    a semiconductor layer positioned between the first and second ferromagnetic layers, the semiconductor layer characterized as a charge transport layer for producing a magnetoresistive signal.

2. The magnetic memory cell of claim 1 wherein the semiconductor layer forms a p-n junction with at least one of the first and second ferromagnetic layers.

3. The magnetic memory cell of claim 1 wherein the semiconductor layer forms a Schottky junction with at least one of the first and second ferromagnetic layers.

4. The magnetic memory cell of claim 1 further comprising:
    a digit line electrically connected to the first ferromagnetic layer; and
    a bit line electrically connected to the second ferromagnetic layer.

5. The magnetic memory cell of claim 4 further comprising a magnetic layer positioned between the second ferromagnetic layer and the bit line for pinning a magnetic vector within the second ferromagnetic layer.

6. The magnetic memory cell of claim 1 further comprising a gate contact spaced apart from the layer of semiconductor material for controlling the electron flow through the semiconductor layer.

7. The magnetic memory cell of claim 6 further comprising:
    a digit line electrically connected to the first ferromagnetic layer; and
    a bit line electrically connected to the second ferromagnetic layer.

8. The magnetic memory cell of claim 7 further comprising a magnetic layer positioned between the second ferromagnetic layer and the bit line for pinning a magnetic vector within the second ferromagnetic layer.

9. A magnetic memory cell comprising:
    a first ferromagnetic material;
    a second ferromagnetic material;
    a semiconductor material positioned between the first and second ferromagnetic materials, the semiconductor layer characterized as a charge transport layer for producing a magnetoresistive signal;
    a first bit line positioned near the first ferromagnetic material and in electrical contact therewith;
    a digit line positioned near the second ferromagnetic material and in electrical contact therewith.

10. The magnetic memory cell of claim 9 wherein a p-n junction is formed between the first ferromagnetic material and the semiconductor material.

11. The magnetic memory cell of claim 9 wherein a Schottky junction is formed between the first ferromagnetic material and the semiconductor material.

12. The magnetic memory cell of claim 9 further comprising a magnetic layer positioned between the second ferromagnetic layer and the bit line for pinning a magnetic vector within the second ferromagnetic layer.

13. The magnetic memory cell of claim 9 further comprising a gate contact spaced apart from the semiconductor material.

14. The magnetic memory cell of claim 13 further comprising a magnetic layer positioned between the second ferromagnetic layer and the bit line for pinning a magnetic vector within the second ferromagnetic layer.

15. A magnetic memory comprising:

a first electrically conductive portion;

a first layer of ferromagnetic material in electrical contact with the first electrically conductive portion;

a second layer of ferromagnetic material;

a layer of semiconductor material positioned between the first and second layers of ferromagnetic material, the semiconductor layer characterized as a charge transport layer for producing a magnetoresistive signal;

a second electrically conductive portion positioned in electrical contact with the second layer of ferromagnetic material, wherein the first layer of ferromagnetic material, the layer of semiconductor material, and the second layer of ferromagnetic material form a magnetic memory cell with the first and second electrically conductive portions forming a sense line; and an electrically conductive digit line positioned adjacent the magnetic memory cell so as to provide a magnetic field, when the digit line is activated, to at least partially switch magnetic vectors on one of the first and second layers of ferromagnetic material from a first direction along a length of the one to a second, substantially opposite direction, along the length of the one.

16. The magnetic memory of claim 15 wherein a p-n junction is formed between the first layer of ferromagnetic material and the layer of semiconductor material.

17. The magnetic memory of claim 15 wherein a Schottky junction is formed between the first layer of ferromagnetic material and the layer of semiconductor material.

18. The magnetic memory of claim 15 further comprising a magnetic layer positioned between the second layer of ferromagnetic material and the bit line for pinning a magnetic vector within the second layer of ferromagnetic material.

19. The magnetic memory of claim 15 further comprising a gate region spaced apart from the layer of semiconductor material for controlling the flow of electrons between the first and second layers of ferromagnetic material and through the layer of semiconductor material.

20. The magnetic memory of claim 19 further comprising a layer of magnetic material positioned between the second layer of ferromagnetic material and the bit line for pinning a magnetic vector within the second layer of ferromagnetic material.

* * * * *

UNITED STATES PATENT AND TRADEMARK OFFICE
CERTIFICATE OF CORRECTION

PATENT NO.   : 6,285,581 B1
DATED        : September 4, 2001
INVENTOR(S)  : Shi et al.

It is certified that error appears in the above-identified patent and that said Letters Patent is hereby corrected as shown below:

<u>Column 1,</u>
Line 3, after the title, please add a new first paragraph the following paragraph:
-- This invention was made with Government support under Agreement No. MDA972-96-3-0016 awarded by DARPA. The Government has certain rights in the invention. --

Signed and Sealed this

Fourth Day of November, 2003

JAMES E. ROGAN
*Director of the United States Patent and Trademark Office*